United States Patent
Carletti

(10) Patent No.: US 9,147,630 B2
(45) Date of Patent: Sep. 29, 2015

(54) POWER SEMICONDUCTOR ASSEMBLY AND MODULE

(71) Applicant: Infineon Technologies AG, Neubiberg (DE)

(72) Inventor: Andrea Carletti, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/786,129

(22) Filed: Mar. 5, 2013

(65) Prior Publication Data

US 2014/0252583 A1    Sep. 11, 2014

(51) Int. Cl.
| | |
|---|---|
| *H01L 23/48* | (2006.01) |
| *H01L 23/34* | (2006.01) |
| *H01L 23/00* | (2006.01) |
| *H01L 23/36* | (2006.01) |
| *H01L 23/40* | (2006.01) |
| *H01L 23/42* | (2006.01) |

(52) U.S. Cl.
CPC ............... *H01L 23/34* (2013.01); *H01L 23/36* (2013.01); *H01L 23/4006* (2013.01); *H01L 23/42* (2013.01); *H01L 24/92* (2013.01); *H01L 2924/1305* (2013.01); *H01L 2924/1306* (2013.01); *H01L 2924/13055* (2013.01)

(58) Field of Classification Search
CPC ............ H01L 23/3672; H01L 23/3675; H01L 23/3677
USPC ......... 257/682, 690, 706, 717, 718, 720, 796, 257/696, 697
See application file for complete search history.

(56) References Cited

U.S. PATENT DOCUMENTS

| | | | |
|---|---|---|---|
| 6,053,394 A * | 4/2000 | Dockerty et al. | 228/180.22 |
| 8,193,043 B2 | 6/2012 | Jeon et al. | |
| 2005/0034841 A1* | 2/2005 | Barr et al. | 165/80.3 |
| 2008/0128878 A1* | 6/2008 | Kuczynski | 257/682 |
| 2009/0027859 A1* | 1/2009 | Giacoma | 361/709 |
| 2009/0296360 A1* | 12/2009 | Doblar et al. | 361/767 |
| 2010/0252922 A1 | 10/2010 | Bayerer et al. | |
| 2013/0001758 A1 | 1/2013 | Moersheim et al. | |

* cited by examiner

*Primary Examiner* — Brook Kebede
(74) *Attorney, Agent, or Firm* — Slater & Matsil, L.L.P.

(57) ABSTRACT

A method and apparatus for assembling a power semiconductor is provided. A device includes a printed circuit board, a heat sink, and a semiconductor chip package. The semiconductor chip package is located between the printed circuit board and the heat sink. A heat-generating surface of the semiconductor chip package is oriented such that the heat-generating surface faces the heat sink.

40 Claims, 10 Drawing Sheets

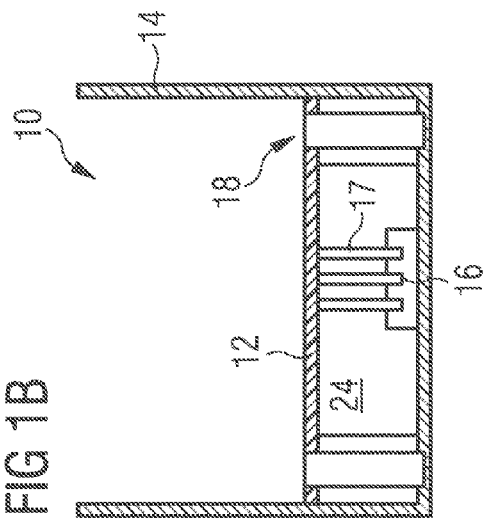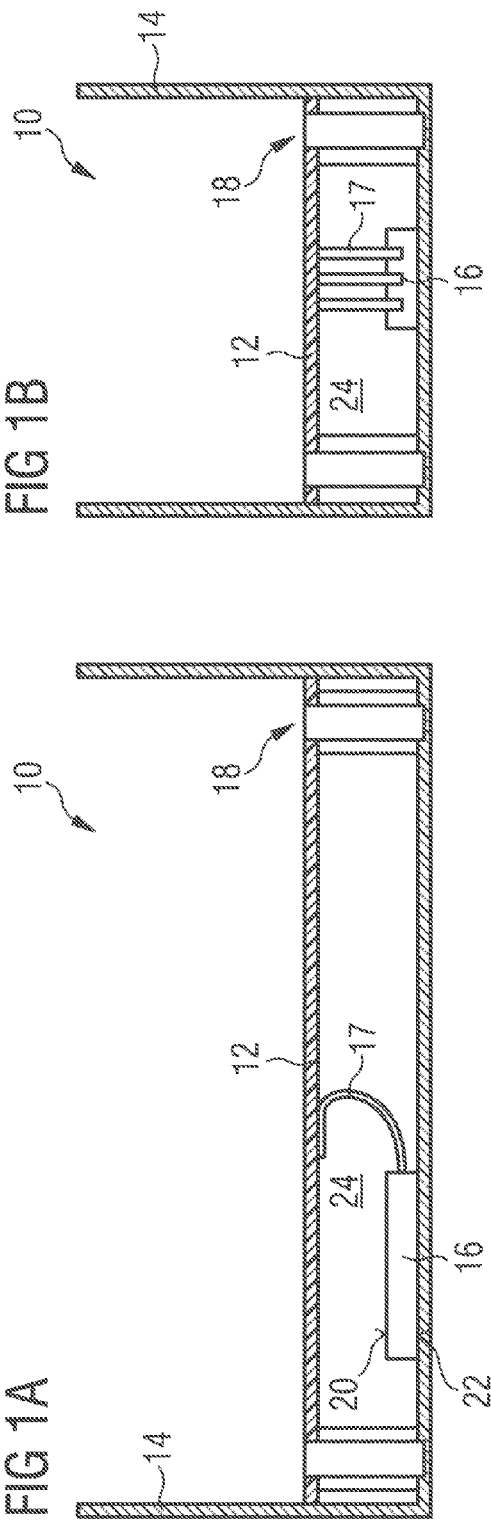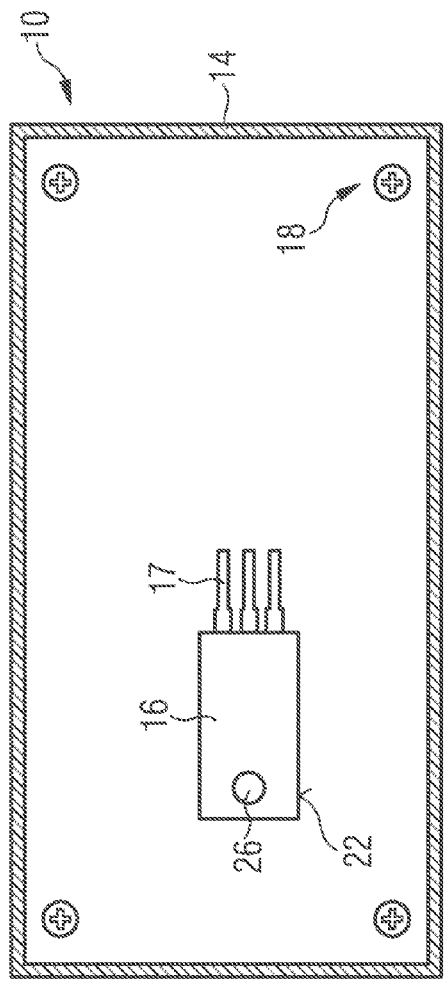

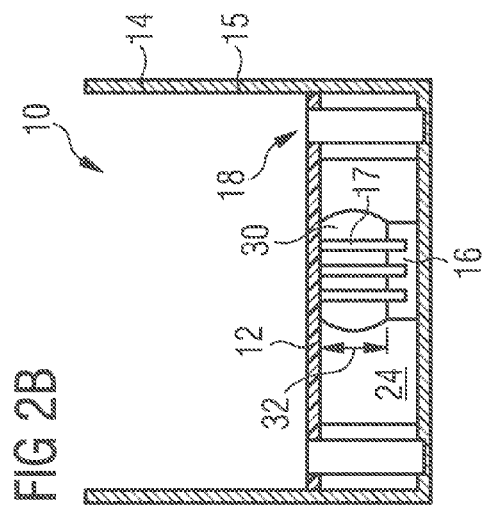
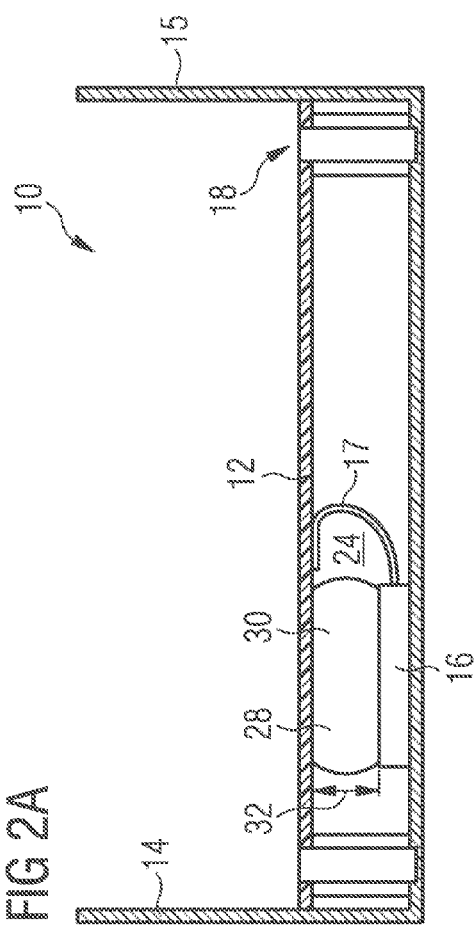
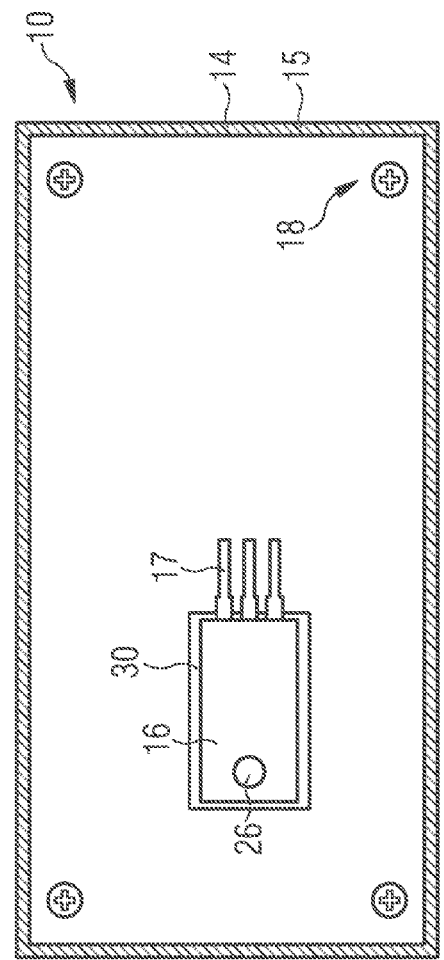

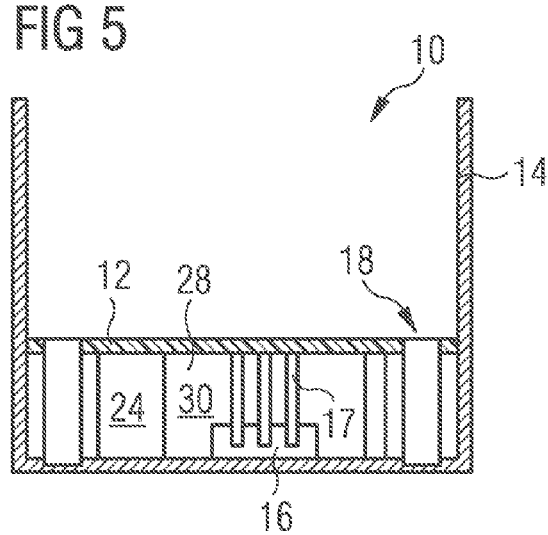
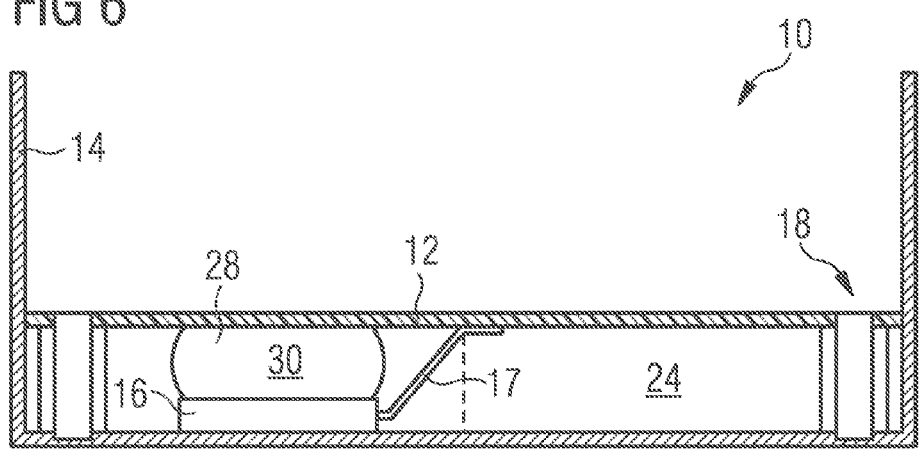
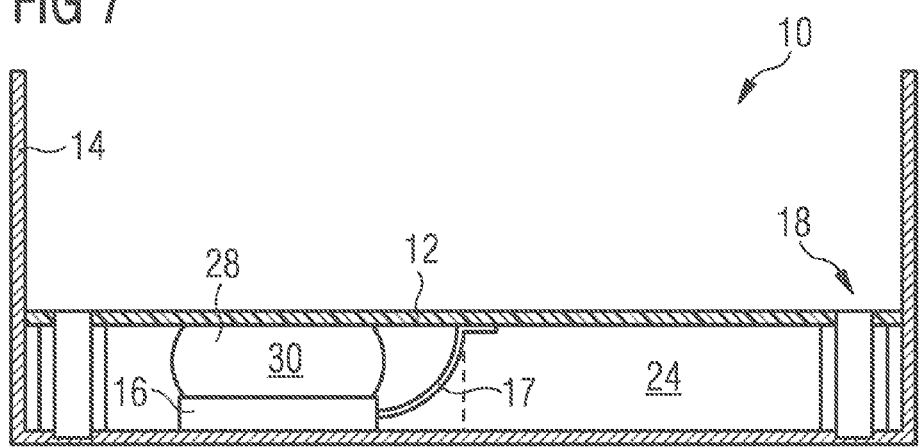

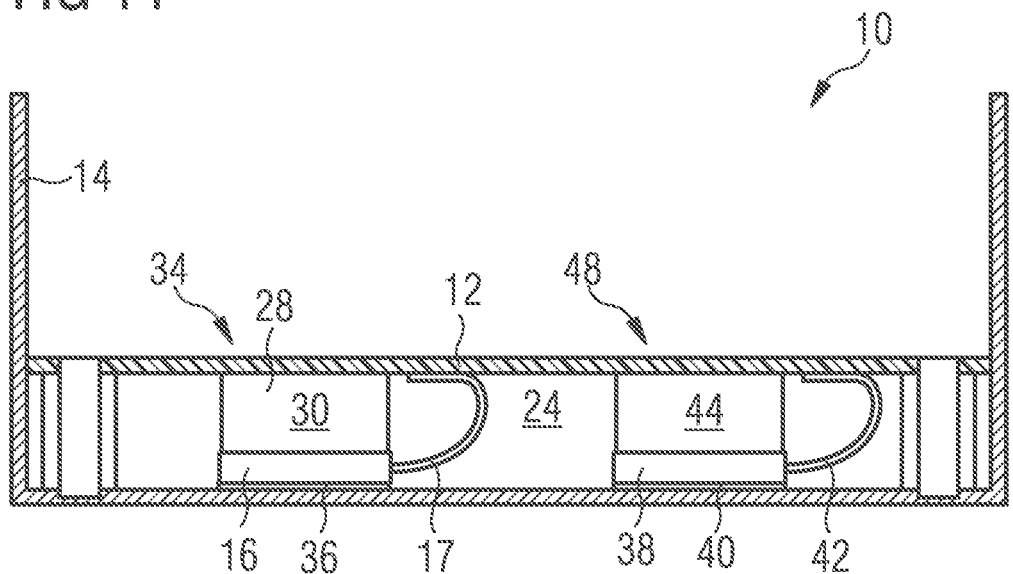
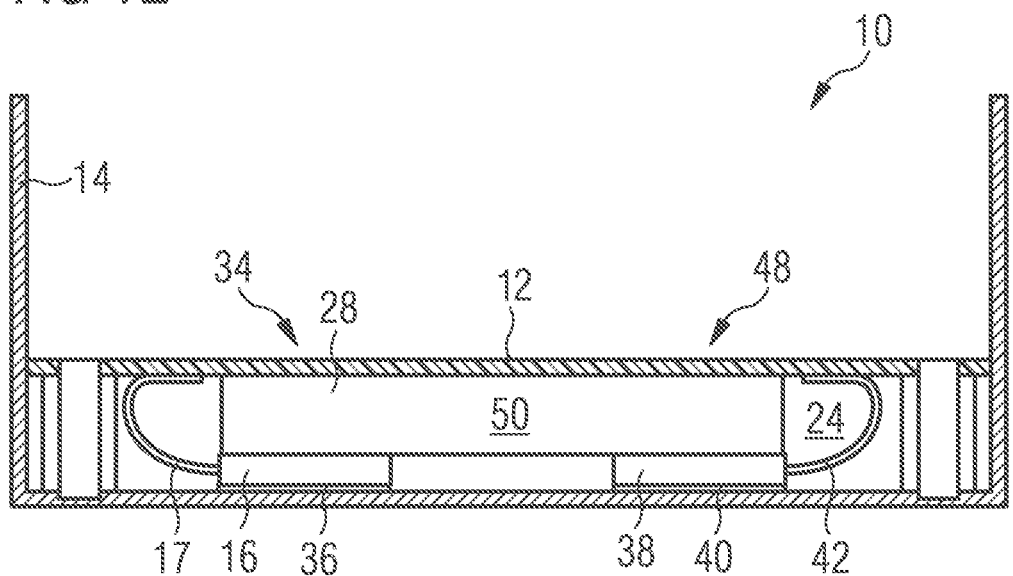

POWER SEMICONDUCTOR ASSEMBLY AND MODULE

TECHNICAL FIELD

The present invention relates generally to semiconductor devices. In particular, embodiments the present invention relates to a method and apparatus for assembling a power semiconductor device using a spacer.

BACKGROUND

In the assembly of semiconductor chip packages, it is desirable to produce the semiconductor chip packages in a way that meets individual needs of consumers. Industrial consumers have a desire to efficiently attach semiconductor packages to boards like printed circuit boards (PCB).

In a semiconductor chip package, the semiconductor chip is embedded or housed within the chip package and the contact pads of the semiconductor chip are connected to external contact elements of the chip package. It is desirable to produce semiconductor chip packages so that their external contact elements allow a higher degree of flexibility with regard to the attachment of the semiconductor chip package to a board. It is also desirable to increase the modular applicability of the semiconductor chip package and, in particular, the possibility to connect further devices to the semiconductor chip package.

Semiconductor chip packages may be used in a variety of applications. These applications may include power applications implemented by chip-based power semiconductor elements such as power transistors, power diodes, and other elements. Such applications may be employed in diverse equipment such as power supplies for personal computer components, electronic lighting equipment, battery-based equipment, and many other types of equipment. With the use of these power elements, it may be desirable to connect the semiconductor chip packages to a thermally conductive device such as a heat sink. If the heat sink does not dissipate heat in a desired manner, components connected to the semiconductor chip packages or the semiconductor chip itself may be damaged.

Further, some currently used methods of assembling semiconductor chip packages, such as power modules that reduce heat dissipation, are expensive and may increase the complexity of the fabrication process. Consequently, there is a general need for cost-efficient solutions in assembling power semiconductor packages such that both the temperature and the temperature gradient of the fabricated package are minimized.

SUMMARY OF THE INVENTION

In accordance with an embodiment of the present invention, a device comprises a printed circuit board, a heat sink, and a semiconductor chip package. The semiconductor chip package is located between the printed circuit board and the heat sink. A heat-generating surface of the semiconductor chip package is oriented such that the heat-generating surface faces the heat sink.

In accordance with another embodiment of the present invention, a device comprises a printed circuit board, an enclosure, a semiconductor chip package, and a bumper pad. The semiconductor chip package is located between the printed circuit board and the enclosure. The bumper pad is located between the printed circuit board and the semiconductor chip package. The bumper pad is configured to pressure mount the semiconductor chip package between the enclosure and the printed circuit board.

In accordance with yet another embodiment of the present invention, a power semiconductor assembly comprises a semiconductor chip package, a plurality of pins, and a bumper pad. The semiconductor chip package has a power semiconductor chip and includes external contact leads. The bumper pad is located over a top surface of the semiconductor chip package. The bumper pad is formed from a flexible, heat resistant material.

In accordance with still another embodiment of the present invention, a method for assembling a power semiconductor is presented. An assembly that includes a semiconductor chip package with a plurality of pins and a bumper pad is provided. The semiconductor chip package is oriented such that the heat producing surface of the semiconductor chip package faces away from the bumper pad. A pin in the plurality of pins is bent. The bumper pad is placed over a surface of a printed circuit board. The pin is soldered to the printed circuit board.

BRIEF DESCRIPTION OF THE DRAWINGS

For a more complete understanding of the present invention, and the advantages thereof, reference is now made to the following descriptions taken in conjunction with the accompanying drawing, in which:

FIG. 1A is an illustration of an embodiment of a device with a semiconductor chip package connected to a heat sink;

FIG. 1B is an illustration of an end view of an embodiment of a device with a semiconductor chip package connected to a heat sink;

FIG. 1C is an illustration of a bottom view of an embodiment of a device with a semiconductor chip package connected to a heat sink;

FIG. 2A is an illustration of an embodiment of a device with a semiconductor chip package connected to an enclosure with a spacer;

FIG. 2B is an illustration of an end view of an embodiment of a device with a semiconductor chip package connected to an enclosure with a spacer;

FIG. 2C is an illustration of a bottom view of an embodiment of a device with a semiconductor chip package connected to an enclosure with a spacer;

FIG. 5 is an illustration of an end view of an embodiment of a semiconductor chip package connected to a heat sink with a spacer;

FIG. 6 is an illustration of an embodiment of a power semiconductor assembly with a bent pin;

FIG. 7 is an illustration of an embodiment of a power semiconductor assembly with another configuration for a bent pin;

FIG. 11 is an illustration of an embodiment of two power semiconductor assemblies connected to an enclosure;

FIG. 12 is an illustration of an embodiment of two power semiconductor assemblies connected to an enclosure with a shared spacer;

DETAILED DESCRIPTION OF ILLUSTRATIVE EMBODIMENTS

Figure 3:
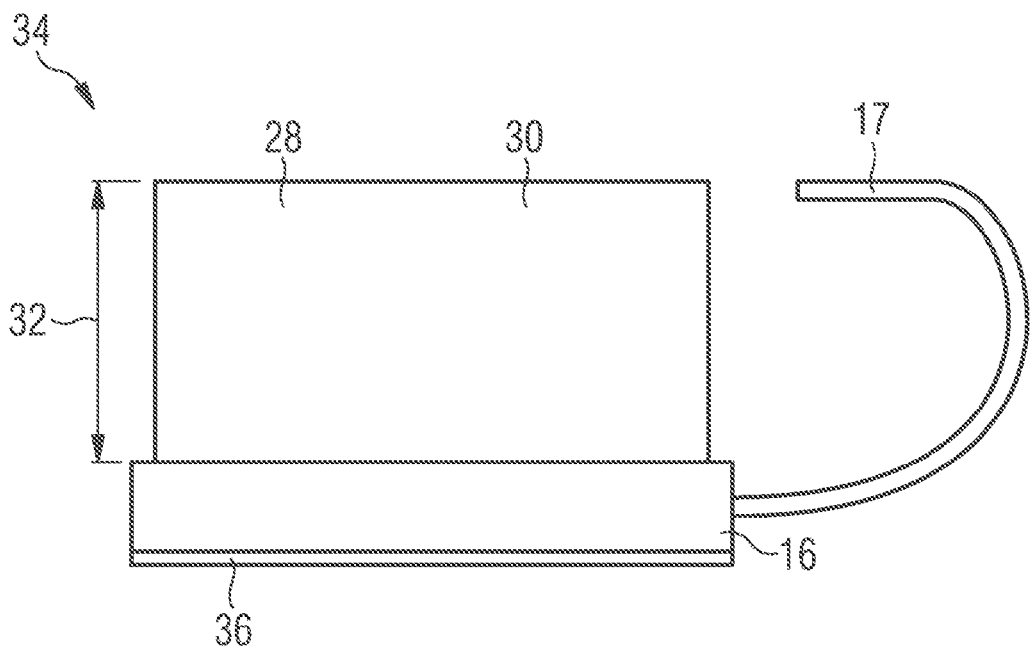
FIG. 3 is an illustration of an embodiment of a power semiconductor assembly with a spacer.

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

In various embodiments, the present invention teaches assembling a semiconductor chip package such that the heat-generating side of the semiconductor chip package is oriented in the direction of a heat sink. Various embodiments use a novel spacing structure to pressure mount the semiconductor chip package to the heat sink thereby obviating the need for screws or other fasteners to connect the semiconductor chip package to the heat sink. In addition, the various embodiments provide the ability to solder the semiconductor chip package to a printed circuit board at the same time as other surface mounted parts. As a result, the various embodiments provide a device that increases the life of the printed circuit board as well as decreases the cost and time of manufacture for such devices.

Turning first to FIG. 1, a device 10 includes a printed circuit board 12, a heat sink 14, and a semiconductor chip package 16. The printed circuit board 12 is secured to the heat sink 14 with fasteners 18 in this example. The fasteners 18 may be screws or other suitable types of fasteners. In this depicted example, the heat sink 14 may be a radiator, an enclosure, or some other suitable component for dissipating heat generated by the semiconductor chip package 16.

As illustrated, the semiconductor chip package 16 is located between the printed circuit board 12 and the heat sink 14. In this case, the semiconductor chip package 16 includes a semiconductor chip, or die, and the appropriate packaging for that chip. These chips are typically packaged within a ceramic or a plastic body to protect from physical damage and corrosion. The packaging also supports the electrical contacts required to connect to the device. Many different types of packaging are available depending on the type and the intended use of the chip being packaged. More than one chip can be included in a semiconductor chip package.

The semiconductor chip package 16 may be any semiconductor chip package that provides desired characteristics for use in the device 10. For example, the semiconductor chip package 16 may be a power semiconductor package such as a field-effect transistor (FET), an insulated-gate bipolar transistor (IGBT), a diode, or some other suitable type of power semiconductor.

In these examples, the semiconductor chip package 16 is not made to be soldered directly on the printed circuit board 12. Rather, space between the semiconductor chip package 16 and the printed circuit board 12 is desired. In some examples, however, this space may be absent and the semiconductor chip package 16 may be fabricated more closely to the printed circuit board 12 than is shown in this figure.

The semiconductor chip package 16 may include leads on pins 17. The pins 17 are bent in these illustrative examples such that a portion of the pins 17 is connected to the semiconductor chip package 16 and another portion of the pins 17 is connected to the printed circuit board 12. The portion of the pins 17 connected to the printed circuit board 12 is soldered to the printed circuit board 12 in this example. More specifically, the pins 17 are soldered to the printed circuit board 12 using surface mount techniques. In this manner, the pins 17 may be soldered to the printed circuit board 12 at the same time as other surface mounted parts.

The semiconductor chip package 16 has a top surface 20 and a bottom surface 22. The top surface 20 is a non-metal surface and the bottom surface 22 could be either a metal or a non-metal surface in these examples. As a result, the bottom surface 22 is a heat-generating surface and the top surface 20 is not a heat-generating surface.

As depicted, the semiconductor chip package 16 may be mounted to the heat sink 14 using at least one of a fastener, an adhesive, a soldered part, or some other suitable type of material (not shown) that secures the semiconductor chip package 16 to the heat sink 14. The semiconductor chip package 16 is secured to the heat sink 14 such that the top surface 20 faces in the direction of the printed circuit board 12. Thus, when the semiconductor chip package 16 is oriented such that the bottom surface 22 faces in the direction of the heat sink 14, much of the heat generated by the semiconductor chip package 16 flows in the direction of the heat sink 14 instead of the printed circuit board 12.

Additionally, space 24 may be present between the printed circuit board 12 and the semiconductor chip package 16. The space 24 may further limit the amount of heat generated by the semiconductor chip package 16 reaching the printed circuit board 12. In this manner, the likelihood of damage to the printed circuit board 12 may be reduced. As a result, the life of the printed circuit board 12 may be extended with the use of the device 10 as shown in this figure.

FIG. 1B provides an illustration of an end view of the device 10 with the semiconductor chip package 16 connected to the heat sink 14. In this view, the pins 17 may be seen more clearly. Although three pins are shown, any plurality of pins may be used, depending on the particular implementation.

FIG. 1C illustrates a bottom view of the device 10. In this illustration, the bottom surface 22 is shown more clearly. The fasteners 18 are also shown connecting the printed circuit board 12 to the heat sink 14 at four points along the heat sink 14.

An opening 26 in the semiconductor chip package 16 is also visible in this view. The opening 26 is an opening in the semiconductor chip package 16 extending from the bottom surface 22 inward through the semiconductor chip package 16. The opening 26 is normally used to fasten the power semiconductor to the heat sink/enclosure. In other cases, the opening 26 may be used to secure the semiconductor chip package 16 to other components in the device 10.

Turning next to FIG. 2A, the device 10 is shown with a spacer 28. Like reference numbers as shown in subsequent figures illustrate components as previously described.

In this example, the spacer 28 may be a bumper pad 30 and may be comprised of a substantially flexible material such that the bumper pad 30 takes up the space 24 between the printed circuit board 12 and the semiconductor chip package 16. In other illustrative examples, the spacer 28 may be another structure other than the bumper pad 30.

In particular, bumper pad 30 pressure mounts the semiconductor chip package 16 to an enclosure 15 such that a fastener, adhesive, or other component is not needed to secure the semiconductor chip package 16 to the enclosure 15. The enclosure 15 is one example of the heat sink 14 shown in FIGS. 1A-1C.

In other examples, the semiconductor chip package 16 also may be pressure mounted to the enclosure 15 using the bumper pad 30, but may also be secured to the enclosure 15 using another component. For instance, the bumper pad 30 may be connected to at least one of the enclosure 15, the printed circuit board 12, and the semiconductor chip package 16 by a soldered part. The bumper pad 30 also may be connected to these components using a fastener or an adhesive. In other words, while an additional fastening device is not necessary with the use of an illustrative embodiment, one may be implemented if desired.

In this example, the bumper pad 30 may be made up of a number of different types of materials. For example, the bumper pad 30 may be comprised of silicone. Other example materials may include cardboard, cloth, metal springs or others.

Materials selected for the bumper pad 30 may be selected such that desired characteristics are achieved. As an example, the material for the bumper pad 30 may be selected to withstand a certain temperature during soldering. For instance, the material for the bumper pad 30 may be selected to withstand temperatures in excess of 300 degrees Celsius. Of course, materials may be selected such that the bumper pad 30 withstands higher and lower temperatures, depending on the particular implementation. Additionally, bumper pad 30 should be comprised of a thermally non-conductive material such that the bumper pad 30 does not heat the printed circuit board 12.

In some cases, it may be desirable to use a particular material during each phase of manufacturing of the device 10. For example, one material that withstands high temperatures may be selected for the bumper pad 30 during the soldering process, and then the bumper pad 30 may be replaced by another bumper pad with different material properties.

Further, the material used for the bumper pad 30 may be selected in order to provide a desired amount of pressure such that the semiconductor chip package 16 does not slide along the inner surface of the enclosure 15. This selected pressure may vary based on the size of the semiconductor chip package 16, the properties of the surface of the enclosure 15, the environment in which the device 10 is installed, or for some other reason.

As depicted, the bumper pad 30 has a thickness 32 after compression. Before compression, the thickness 32 is greater than shown in this figure. The thickness 32 may be selected based on a number of different characteristics. For example, the thickness 32 may be selected based on the amount of pressure needed to secure the semiconductor chip package 16 to the enclosure 15.

In addition, the thickness 32 may be selected based on the size of the space 24 between the printed circuit board 12 and the semiconductor chip package 16. Thus, the thickness 32 may be selected to provide a desired distance between the printed circuit board 12 and the semiconductor chip package 16. Consequently, the thickness 32 of the bumper pad 30 for larger chips that generate more heat may be greater than the thickness 32 for smaller chips that generate less heat. The use of the bumper pad 30 with the thickness 32 allows the device 10 to be manufactured to extend the life of the printed circuit board 12 by dissipating heat in a desired manner.

The properties of the bumper pad 30 filling space 24 between the semiconductor chip package 16 and the printed circuit board 12 further reduce the amount of heat reaching the printed circuit board 12. Since the bumper pad 30 is thermally non-conductive, it essentially insulates the printed circuit board 12 from heat generated by the semiconductor chip package 16. In this manner, the likelihood of damage to the printed circuit board 12 may be reduced. As a result, the life of the printed circuit board 12 may be extended with the use of an embodiment of the device 10 with the bumper pad 30. Moreover, the cost of manufacturing the device 10 may be reduced because the semiconductor chip package 16 does not need to be secured to the enclosure 15 using a fastener or other component. Instead, only the bumper pad 30 is needed to pressure mount the semiconductor chip package 16 to the enclosure 15.

FIG. 2B provides an end view of the device 10 with the spacer 28 and FIG. 2C illustrates a bottom view of the device 10 with the spacer 28. As depicted, a portion of the bumper pad 30 is seen through the opening 26. In some illustrative examples, a portion of the bumper pad 30 is associated with the opening 26 such that the bumper pad 30 is secured to the semiconductor chip package 16. In other words, a portion of the bumper pad 30 is pushed into the opening 26. This configuration of an illustrative embodiment may increase the stability of the bumper pad 30 and the semiconductor chip package 16 such that an additional adhesive or other component is unnecessary.

In other examples, the bumper pad 30 may be visible through the opening 26 in this view without a portion of the bumper pad 30 being inserted into the opening 26. The amount of the bumper pad 30 pressed into the opening 26 may depend on the properties of the bumper pad 30, the amount of pressure exerted on the semiconductor chip package 16, or other factors. Since the semiconductor chip package 16 does not need to be screwed directly to the printed circuit board 12, the opening 26 is not needed in many embodiments.

FIG. 3 illustrates a power semiconductor assembly 34 with the spacer 28. The power semiconductor assembly 34 may be implemented using a variety of semiconductor chip packages, examples of which are described in FIGS. 14-16. In other embodiments, chips other than power semiconductor chips can be used.

In this view, a portion of the pins 17 have been bent such that the top portion of the pins 17 is flush with upper surface 37 of the spacer 28 in this example. When the power semiconductor assembly 34 is connected to another component, this portion of the pins 17 may be soldered to the component. For example, the pins 17 may be soldered to a printed circuit board. The pins 17 are external contact leads in these examples.

In other examples, the pins 17 may not be bent such that a portion of the pins 17 is flush with the upper surface 37 of the spacer 28. For example, if increased pressure is desired, the spacer 28 may have a thickness greater than the height of the pins 17. In this case, the spacer 28 in the power semiconductor assembly 34 may be larger than shown in this example.

As depicted, this thickness 32 is the thickness before compression. Thus, the thickness 32 shown in this figure is greater than thickness 32 shown in FIGS. 2A-2B.

An isolation foil 36 also could be present in the power semiconductor assembly 34. The isolation foil 36 is a thermally conductive foil in these examples. In some examples, the semiconductor chip package could be fully isolated, e.g., sometimes referred to as a "full pack." These types of semiconductor chip packages might not use any additional isolation foil, e.g., since the outer surface provides the isolation. Other semiconductor chip packages with metal plates could require isolation. Accordingly, in some examples, the isolation foil 36 may be omitted. Examples of material for the isolation foil 36 include any material that is thermally conductive and preferably electrically insulative.

Further, a number of power semiconductor assemblies other than the power semiconductor assembly 34 may share the same isolation foil. In this case, an isolation foil may line the inner surface of an enclosure. One or more power semiconductor assemblies are then placed on the isolation foil and secured to the isolation foil with an adhesive or other suitable component. In still other examples, the power semiconductor assemblies may be attached to the isolation foil and then installed in the enclosure.

FIGS. 4A-4E schematically illustrate a method for assembling a power semiconductor with a spacer. The process illustrated in FIGS. 4A-4E is not meant to limit the order of the steps or the manner in which this method may be performed.

Figure 4A:
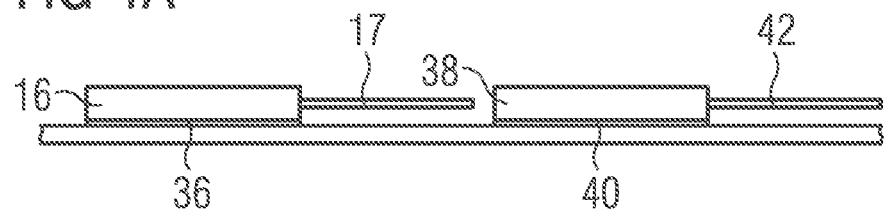
FIGS. 4A-4E are illustrations of a method for assembling a power semiconductor with a spacer.

FIG. 4A shows the semiconductor chip package 16 during the assembly process. A semiconductor chip package 38 is also present in this illustration. The semiconductor chip package 16 has been placed on the isolation foil 36 and the semiconductor chip package 38 has been placed on an isolation foil 40. In other examples, the semiconductor chip package 16 and the semiconductor chip package 38 may share the same isolation foil. In still other illustrative examples, an isolation foil may be absent during manufacturing of a power semiconductor assembly. Additional semiconductor chip packages also may be manufactured with the semiconductor chip package 16 and the semiconductor chip package 38. For example, ten packages, 50 packages, 1000 packages, or some other number of packages may be manufactured substantially concurrently using the method described herein.

In this illustration, the semiconductor chip package 16 is shown with unbent pins 17 and the semiconductor chip package 38 has unbent pins 42. The pins 17 and the pins 42 may be any number of pins, depending on the functionality of the semiconductor chip package 16 and the semiconductor chip package 38. Thus, the semiconductor chip package 16 and the semiconductor chip package 38 may have the same or a different number of pins in some illustrative examples.

Figure 4B:
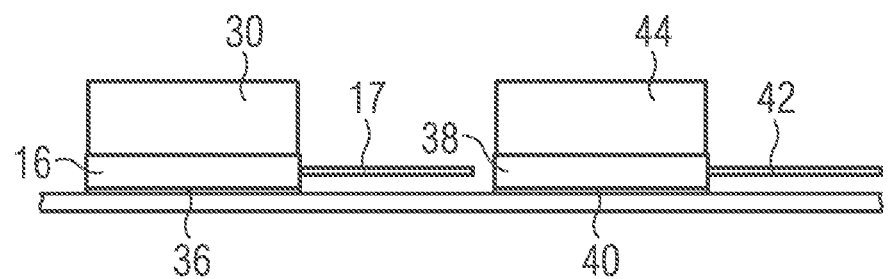

In FIG. 4B, the bumper pad 30 has been placed on the semiconductor chip package 16 and the bumper pad 44 has been placed on the semiconductor chip package 38. The semiconductor chip package 16 with the pins 17 is connected to the bumper pad 30 such that the metal surface of the semiconductor chip package 16 faces opposite the bumper pad 30. In the same way, the semiconductor chip package 38 with the pins 42 is connected to the bumper pad 44 such that the metal surface of the semiconductor chip package 38 faces opposite the bumper pad 44.

The bumper pad 30 and the bumper pad 44 may be placed on the semiconductor chip package 16 and the semiconductor chip package 38 in a number of different ways. For example, a gel material may be selected for the bumper pad 30 and the bumper pad 44 such that the gel material is dispensed onto the surface of the semiconductor chip package 16 and the semiconductor chip package 38. In this case, the bumper pad 30 and the bumper pad 44 may solidify on or around the semiconductor chip package 16 and the semiconductor chip package 38. The bumper pads may then be shaped as desired. In other examples, the bumper pad 30 and bumper bad 44 may already be solidified (e.g., solid blocks) and may be secured on the semiconductor chip package 16 and the semiconductor chip package 38, respectively, using an adhesive. Although the bumper pad 30 and the bumper pad 44 are shown in a rectangular shape in these illustrative examples, the bumper pad 30 and the bumper pad 44 may be any number of shapes and sizes.

Figure 4C:
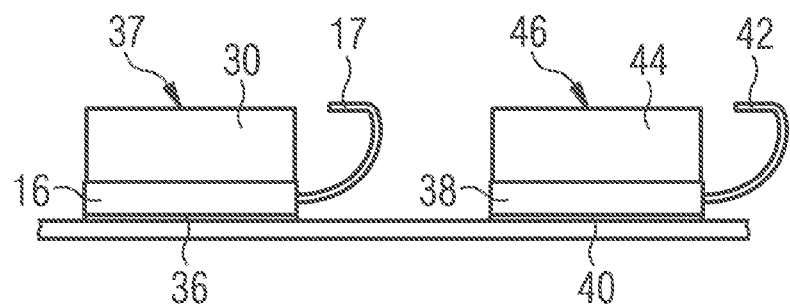

With reference next to FIG. 4C, the pins 17 and the pins 42 have been bent. In this example, the pins 17 are bent such that the top portion of the pins 17 is flush with the upper surface 37 of the bumper pad 30. Similarly, the pins 42 are bent such that the top portion of the pins 42 is flush with an upper surface 46 of the bumper pad 44.

In other examples, the pins 17 and the pins 42 may be bent such that a portion of the pins 17 and the pins 42 is above or below the upper surface 37 and the upper surface 46, respectively, such that electrical connection is possible. In either case, the pins 17 and the pins 42 may be easily soldered to a printed circuit board such as the printed circuit board 12 in FIG. 2A.

Figure 4D:
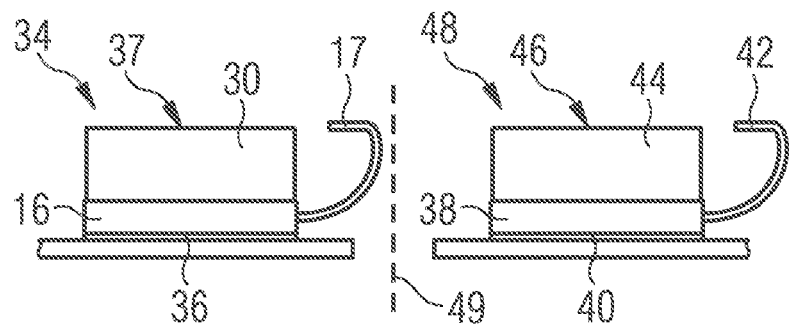

In FIG. 4D, the semiconductor chip package 16 and the semiconductor chip package 38 are separated from each other through line 49. Thus, the semiconductor chip package 16, the isolation foil 36, the pins 17, and the bumper pad 30 form the power semiconductor assembly 34. Likewise, the semiconductor chip package 38, the isolation foil 40, the pins 42, and the bumper pad 44 form a power semiconductor assembly 48.

In alternative implementations of an illustrative embodiment, the semiconductor chip package 16 and the semiconductor chip package 38 may not be separated. Rather, a single power semiconductor assembly including all of the components shown in FIG. 4D may be placed into an enclosure and secured to a printed circuit board. Moreover, more than two chips may be included in the same power semiconductor assembly.

The process illustrated in FIGS. 4A-4D provides a power semiconductor assembly that may be used in a variety of settings. Any number of components in this assembly may be modified to provide desired characteristics for implementation in a device, such as device 10 in FIG. 2A.

Figure 4E:
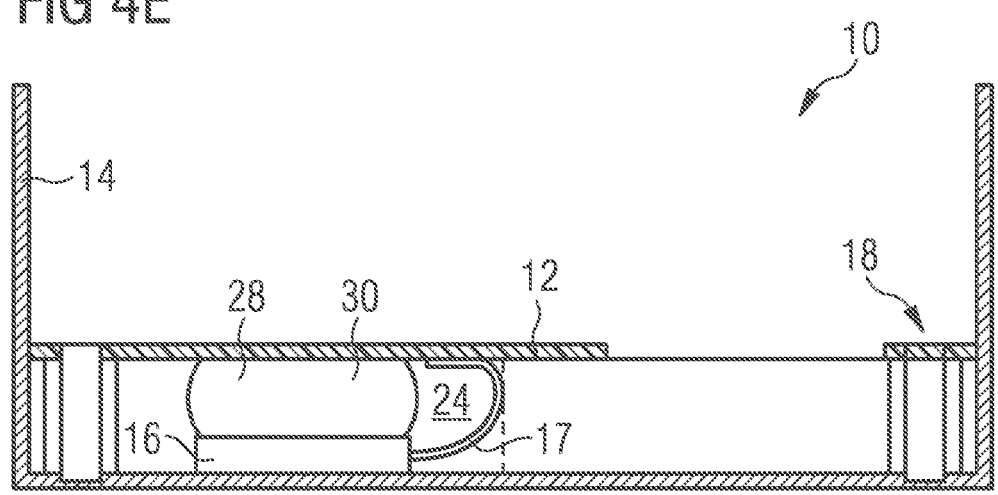

With reference to FIG. 4E, the power semiconductor assembly 34 has been placed between the printed circuit board 12 and the heat sink 14. In this example, the isolation foil 36 is not shown. The isolation foil 36 may not be necessary. In this illustration, the bumper pad 30 is placed on the printed circuit board 12. The pins 17 are then soldered to the printed circuit board 12 at the same time as other components using a surface mount technique. Thus, steps may be eliminated from the manufacturing process and cost savings may be realized.

Next, the power semiconductor assembly 34 with the printed circuit board 12 is secured to the heat sink 14 with the fasteners 18. As described above, the bumper pad 30 pressure mounts the semiconductor chip package 16 to the heat sink 14 such that an additional fastener is unnecessary. The device 10 may then be used in a variety of power applications.

FIG. 5 illustrates an end view of the device 10 with a different configuration for the bumper pad 30. In this view, the bumper pad 30 covers a portion of the semiconductor chip package 16 on at least two sides in this example. In other examples, the bumper pad 30 may encapsulate the semiconductor chip package 16. The embodiment illustrated in this view may increase the stability of the device. Moreover, the properties of the bumper pad 30 may further limit potential damage to the printed circuit board 12, ensuring that heat generated by the semiconductor chip package 16 flows in the direction of the heat sink 14.

Figure 8:
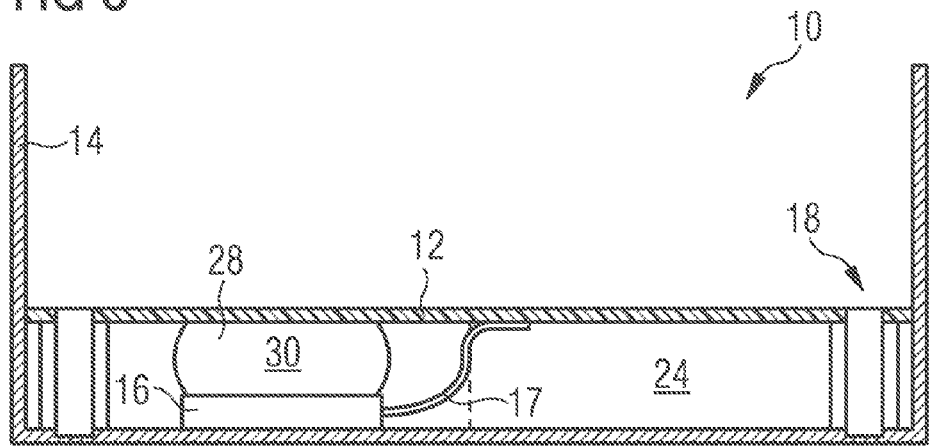
FIG. 8 is an illustration of an embodiment of a power semiconductor assembly with yet another configuration for a bent pin.

FIGS. 6-10 schematically illustrate different configurations for bent pins for use in an illustrative embodiment. In particular, FIGS. 6-8 show different configurations for the bent pins 17 soldered to the printed circuit board 12 using surface mounting techniques. In these figures, the pins 17 have been bent according to the process described in FIGS. 4C-4E. In contrast with the bent pins 17 in FIGS. 4C-4E, the pins 17 in FIGS. 6-8 are bent to face away from the bumper pad 30. As a result, a different surface of the pins 17 is soldered to the printed circuit board 12 than is shown in previous illustrations.

Figure 9:
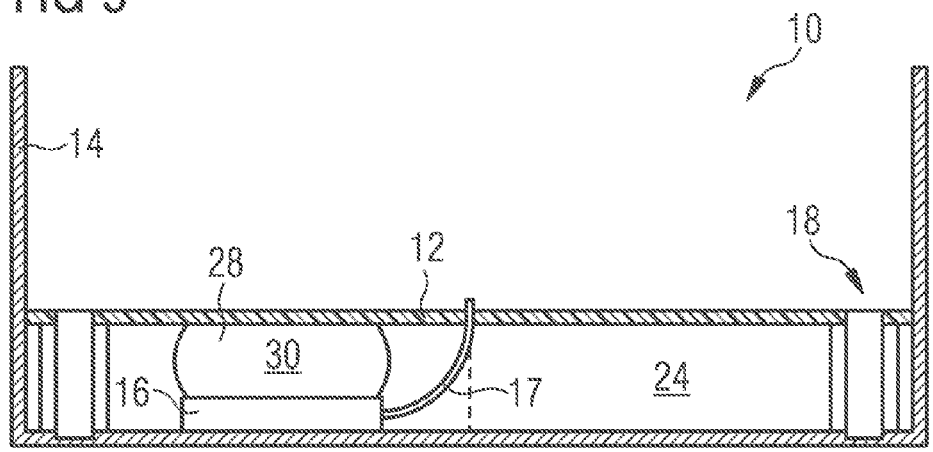
FIG. 9 is an illustration of an embodiment of a power semiconductor assembly with still another configuration for a bent pin.
Figure 10:
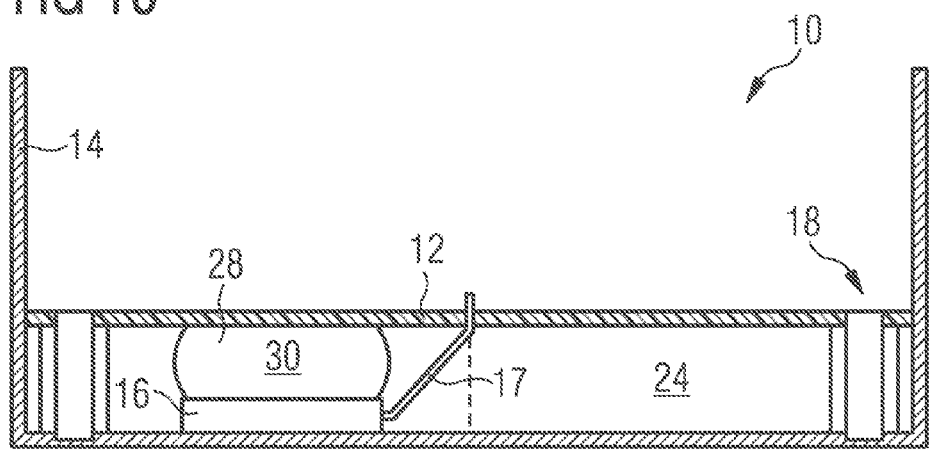
FIG. 10 is an illustration of an embodiment of a power semiconductor assembly with yet another configuration for a bent pin.

FIG. 9 and FIG. 10 show the bent pins 17 configured for soldering to the printed circuit board 12 using a through hole soldering techniques. In this process, the pins 17 are bent such that a portion of the pins protrude through a hole in the printed circuit board 12. The pins 17 are then soldered to the printed circuit board 12.

As can be seen from FIGS. 6-10, a variety of different configurations may be used for the pins 17, depending on the particular implementation. Further, different types of soldering techniques provide different manufacturing advantages and/or cost savings, depending on the functionality involved. FIGS. 6-10 show that a power semiconductor assembly as manufactured using the method in FIGS. 4A-4E may be secured to the printed circuit board 12 in many ways. However, the configuration of the pins 17 is not intended to limit the manner in which a power semiconductor assembly may be implemented.

FIG. 11 illustrates the power semiconductor assembly 34 and the power semiconductor assembly 48 connected to the heat sink 14. The power semiconductor assembly 34 and the power semiconductor assembly 48 are electrically connected to each other in these illustrative examples.

FIG. 12 provides an illustration of the power semiconductor assembly 34 and the power semiconductor assembly 48 connected to the heat sink 14 using a single bumper pad. In this example, the pins 17 are shown on the opposite side from the pins 17 in FIGS. 4A-4E.

As depicted, the bumper pad 30 and the bumper pad 44 have been removed and replaced with a bumper pad 50. The bumper pad 50 pressure mounts both the semiconductor chip package 16 and the semiconductor chip package 38 to the heat sink 14 at the same time using substantially the same amount of pressure.

In alternative implementations of an illustrative embodiment, additional semiconductor chip packages may be pressure mounted to the heat sink 14 using the bumper pad 50. Additionally, the isolation foil 36 and the isolation foil 40 may be replaced with a single isolation sheet that is connected to the inner surface of the heat sink 14.

The illustrations of the power semiconductor assembly 34 and the power semiconductor assembly 48 in FIG. 11 and FIG. 12 are not meant to limit the manner in which multiple semiconductor assemblies may be implemented in an illustrative embodiment. Additional semiconductor chip packages, isolation foils, bumper pads, and pins may be used depending on the particular implementation for a device in accordance with an illustrative embodiment.

Figure 13A:
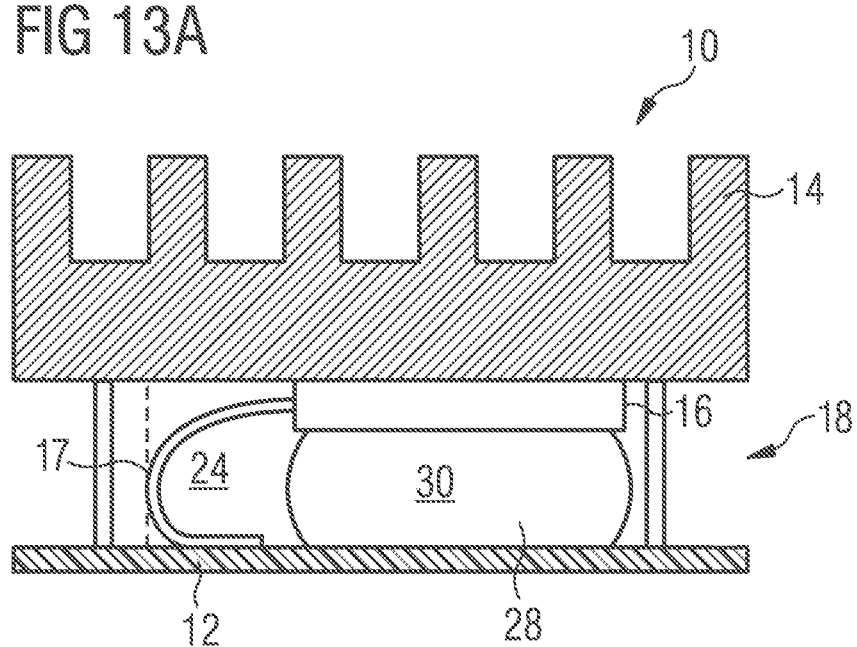
FIG. 13A is an illustration of an embodiment of a device with a semiconductor chip package connected to a heat sink with a spacer.
Figure 13B:
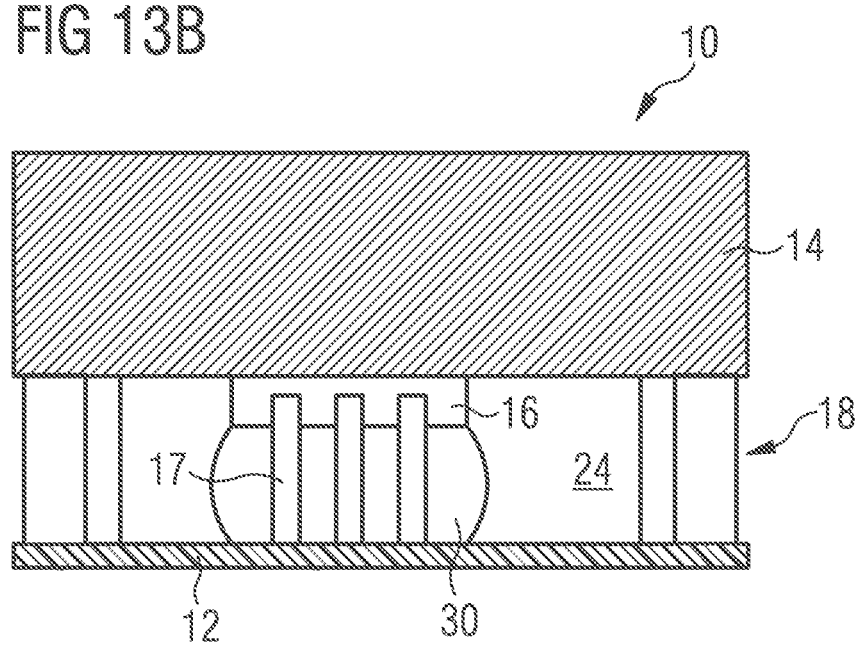
FIG. 13B is an illustration of an embodiment of an end view of a semiconductor chip package connected to a heat sink with a spacer.

FIG. 13A illustrates the device 10 with an alternate configuration for heat sink 14. As shown in this view, the semiconductor chip package 16 does not need to be fully enclosed. Instead, a desired amount of heat dissipation from this configuration of the heat sink 14 is achieved without an enclosure. FIG. 13B illustrates an end view of the device 10 with the alternate configuration for heat sink 14.

While the embodiment of FIGS. 13A and 13B could also be semiconductor power chips, this example is provided to illustrate the fact that any type of heat producing device could utilize concepts disclosed herein. For example, the semiconductor chip package 16 could be a high speed processor that generates heat. Of course, many other examples are also possible.

Figure 14:
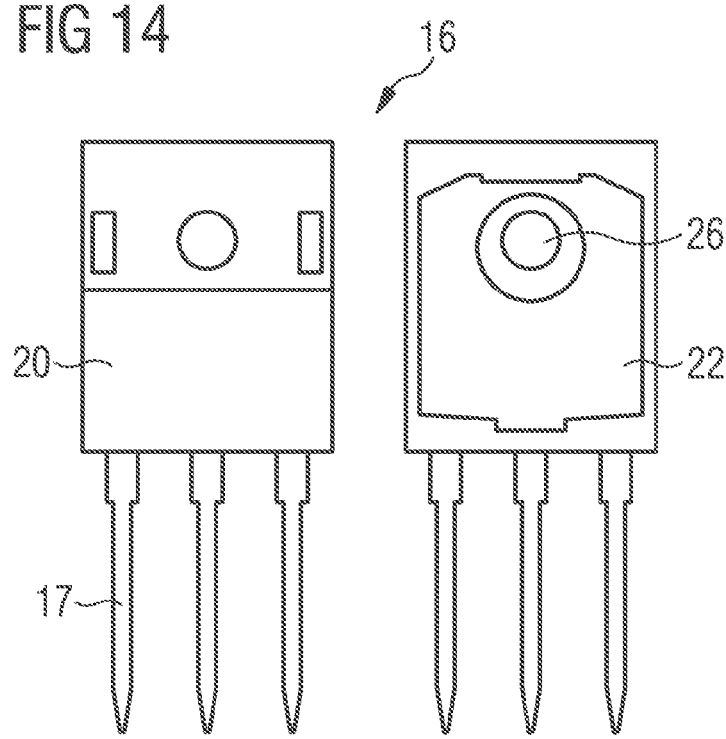
FIG. 14 is an illustration of an embodiment of a power semiconductor chip package.

FIG. 14 illustrates the semiconductor chip package 16 in a standard form. The top surface 20 and the bottom surface 22 of the semiconductor chip package 16 are shown more clearly. The opening 26 is also visible in this illustration. This configuration for the semiconductor chip package 16 may be used with the isolation foil 36 in the power semiconductor assembly 34 shown in FIG. 3.

Figure 15:
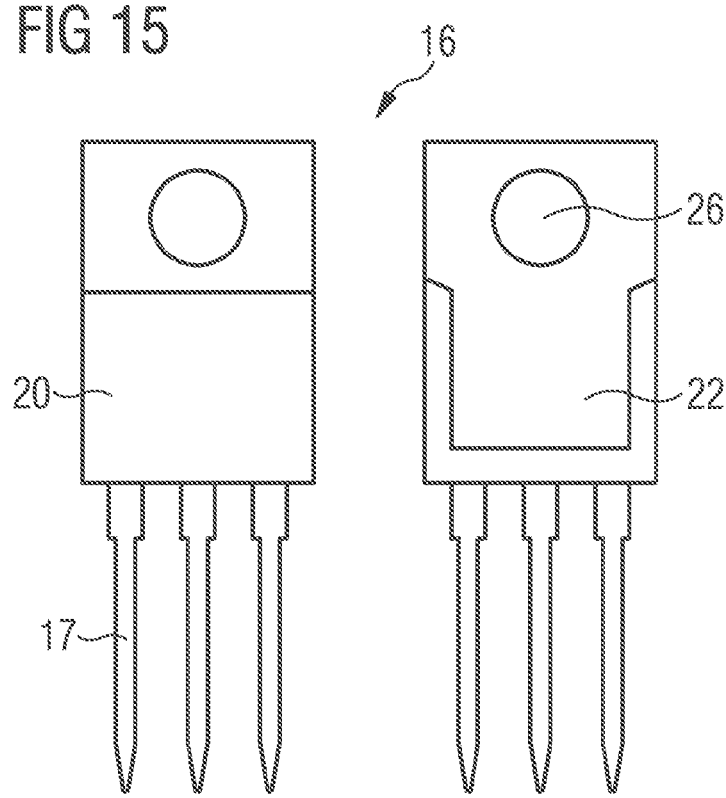
FIG. 15 is an illustration of an embodiment of another power semiconductor chip package.

FIG. 15 illustrates another configuration for the semiconductor chip package 16. The top surface 20 and the bottom surface 22 of the semiconductor chip package 16, as well as opening 26, are shown. The size and shape of each of these components is slightly different than that of the semiconductor chip package 16 as shown in FIG. 14. The semiconductor chip package 16 in this figure may also be used with isolation foil 36.

Figure 16:
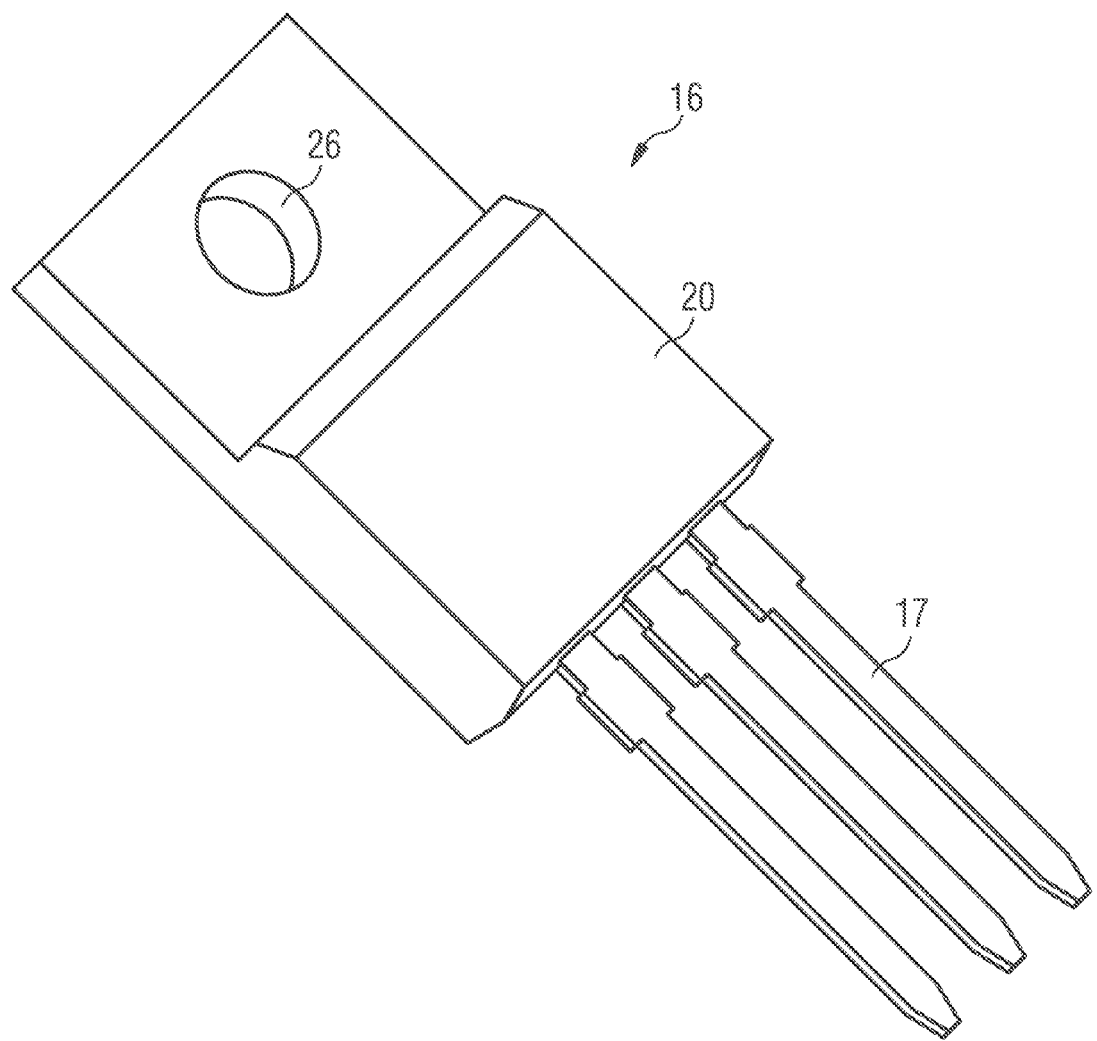
FIG. 16 is an illustration of an embodiment of yet another power semiconductor chip package.

FIG. 16 shows yet another configuration for the semiconductor chip package 16. In this example, the semiconductor chip package 16 is a "full pack" without a metal plate. Thus, the semiconductor chip package 16, as shown in this figure, does not need the isolation foil 36 between it and the heat sink 14.

As can be seen from FIGS. 14-16, an illustrative embodiment may be used with a variety of different types of semiconductor chip packages, depending on the desired performance and/or cost considerations of manufacturing. Of course, the illustrations of the semiconductor chip packages in FIGS. 14-16 does not limit the manner in which the semiconductor chip package 16 may be implemented. Other configurations in addition to or in place of the ones shown in FIGS. 14-16 may be used.

Thus, the present invention provides a method and apparatus for assembling a power semiconductor. A semiconductor chip package is assembled such that the heat-generating side of the semiconductor chip package is oriented in the direction of a heat sink. Various embodiments use a novel spacing structure to pressure mount the semiconductor chip package to the heat sink thereby obviating the need for screws or other fasteners to connect the semiconductor chip package to the heat sink. In addition, various embodiments provide the ability to solder the semiconductor chip package to a printed circuit board at the same time as other surface mounted parts.

With the use of an illustrative embodiment, a printed circuit board can be populated with components on the side of the semiconductor chip package such that a proper distance is maintained between the printed circuit board and the heat sink. Further, in some implementations, all semiconductor chip package on the same side of the printed circuit board can use the same bumper bad and the same isolation foil. In this manner, the various embodiments provide a device that increases the life of the printed circuit board. This process also decreases the cost and time of manufacture for such devices.

While this invention has been described with reference to illustrative embodiments, this description is not intended to be construed in a limiting sense. Features of the various embodiments may be used together. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
   a printed circuit board;
   an enclosure;
   a first semiconductor chip package located between the printed circuit board and the enclosure; and
   a bumper pad located between the printed circuit board and the first semiconductor chip package, wherein the bumper pad pressure mounts the first semiconductor chip package between the enclosure and the printed circuit board, wherein the semiconductor chip package comprises a plurality of pins comprising a portion flush with an upper surface of the bumper pad and bent towards an upper surface of the bumper pad.

2. The device according to claim 1, wherein the first semiconductor chip package comprises a heat-generating surface oriented such that the heat-generating surface is in contact with the enclosure.

3. The device according to claim 2, wherein the heat-generating surface comprises a metal surface.

4. The device according to claim 1, wherein the plurality of pins is soldered to the printed circuit board.

5. The device according to claim 1, wherein the bumper pad comprises silicone.

6. The device according to claim 1, wherein the printed circuit board is connected to the enclosure with a fastener.

7. The device according to claim 1, further comprising an isolation foil between the first semiconductor chip package and the enclosure.

8. The device according to claim 1, further comprising a second semiconductor chip package within the enclosure laterally adjacent to the first semiconductor chip package.

9. The device according to claim 8, wherein the second semiconductor chip package is pressure mounted between the printed circuit board and the enclosure and is electrically coupled to the printed circuit board.

10. The device according to claim 8, further comprising an isolation foil located between the first semiconductor chip package and the enclosure and the second semiconductor chip package and the enclosure.

11. The device according to claim 1, wherein the bumper pad pressure mounts the second semiconductor chip package between the enclosure and the printed circuit board.

12. A method comprising:
    providing an assembly that includes a first semiconductor chip package with a plurality of pins and a bumper pad overlying the first semiconductor chip package, wherein the first semiconductor chip package is oriented such that a heat producing surface of the first semiconductor chip package faces away from the bumper pad;
    bending the pins away from the heat producing surface of the first semiconductor chip package toward an upper surface of the bumper pad, wherein, after the bending, the pins comprise a portion flush with an upper surface of the bumper pad and bent towards an upper surface of the bumper pad;
    placing the assembly over a printed circuit board such that the upper surface of the bumper pad faces the printed circuit board; and
    attaching the pins to the printed circuit board.

13. The method according to claim 12, further comprising attaching a heat sink to the heat producing of the first semiconductor chip package.

14. The method according to claim 12, further comprising attaching the printed circuit board to an enclosure so that the first semiconductor chip package and the bumper pad are pressure fit between the enclosure and the printed circuit board.

15. The method according to claim 12, wherein the pins remain bent after placing the bumper pad over the surface of the printed circuit board.

16. The method according to claim 12, wherein the heat producing surface of the first semiconductor chip package comprises a metal surface.

17. The method according to claim 12, wherein the attaching comprises surface mount soldering.

18. The method according to claim 12, further comprising:
    mounting a second semiconductor chip package under the bumper pad, wherein the second semiconductor chip package is oriented such that a heat producing surface of the second semiconductor chip package faces away from the bumper pad.

19. The method according to claim 18, wherein the first semiconductor package and the second semiconductor package are pressure mounted between the bumper pad and the printed circuit board.

20. A device comprising:
    a printed circuit board;
    an enclosure;
    a first semiconductor chip package located between the printed circuit board and the enclosure; and
    a bumper pad located between the printed circuit board and the first semiconductor chip package, wherein the bumper pad pressure mounts the first semiconductor chip package between the enclosure and the printed circuit board, wherein the semiconductor chip package comprises a plurality of pins comprising a portion flush with an upper surface of the bumper pad and bent away from the upper surface of the bumper pad.

21. The device according to claim 20, wherein the first semiconductor chip package comprises a heat-generating surface oriented such that the heat-generating surface is in contact with the enclosure.

22. The device according to claim 21, wherein the heat-generating surface comprises a metal surface.

23. The device according to claim 20, wherein the plurality of pins is soldered to the printed circuit board.

24. The device according to claim 20, wherein the bumper pad comprises silicone.

25. The device according to claim 20, wherein the printed circuit board is connected to the enclosure with a fastener.

26. The device according to claim 20, further comprising an isolation foil between the first semiconductor chip package and the enclosure.

27. The device according to claim 20, further comprising a second semiconductor chip package within the enclosure laterally adjacent to the first semiconductor chip package.

28. The device according to claim 27, wherein the second semiconductor chip package is pressure mounted between the printed circuit board and the enclosure and is electrically coupled to the printed circuit board.

29. The device according to claim 27, further comprising an isolation foil located between the first semiconductor chip package and the enclosure and the second semiconductor chip package and the enclosure.

30. A device comprising:
    a printed circuit board;
    a heat sink;
    a first semiconductor chip package located between the printed circuit board and the heat sink, wherein the heat sink comprises a cavity in which the printed circuit board and the first semiconductor chip package are mounted; and a thermally non-conductive bumper pad located between the printed circuit board and the first semiconductor chip package, wherein the bumper pad pressure mounts the first semiconductor chip package between the heat sink and the printed circuit board.

31. The device according to claim 30, wherein the first semiconductor chip package comprises a heat-generating surface oriented such that the heat-generating surface is in contact with the heat sink.

32. The device according to claim 31, wherein the heat-generating surface comprises a metal surface.

33. The device according to claim 30, wherein the first semiconductor chip package comprises a plurality of pins soldered to the printed circuit board.

34. The device according to claim 30, wherein the bumper pad comprises silicone.

35. The device according to claim 30, wherein the printed circuit board is connected to the heat sink with a fastener.

36. The device according to claim 30, further comprising an isolation foil between the first semiconductor chip package and the heat sink.

37. The device according to claim 30, further comprising a second semiconductor chip package within the heat sink laterally adjacent to the first semiconductor chip package.

38. The device according to claim 37, wherein the second semiconductor chip package is pressure mounted between the printed circuit board and the heat sink and is electrically coupled to the printed circuit board.

39. The device according to claim 37, further comprising an isolation foil located between the first semiconductor chip package and the heat sink and the second semiconductor chip package and the heat sink.

40. The device according to claim 30, wherein the semiconductor chip package comprises a plurality of pins comprising a portion flush with an upper surface of the bumper pad.

* * * * *